(12) United States Patent
Takahashi et al.

(10) Patent No.: US 6,828,369 B2
(45) Date of Patent: Dec. 7, 2004

(54) SHEET FOR CONDUCTING HEAT

(75) Inventors: Kouya Takahashi, Tokyo (JP); Natsuko Ishihara, Tokyo (JP)

(73) Assignee: Polymatech Co., Ltd, Tokyo (JP)

( * ) Notice: Subject to any disclaimer, the term of this patent is extended or adjusted under 35 U.S.C. 154(b) by 0 days.

(21) Appl. No.: 10/375,159

(22) Filed: Feb. 27, 2003

(65) Prior Publication Data
US 2003/0170446 A1 Sep. 11, 2003

(30) Foreign Application Priority Data

Mar. 5, 2002 (JP) ........................................ 2002-059357

(51) Int. Cl.$^7$ ................................................ C08K 3/20
(52) U.S. Cl. ...................... 524/430; 523/220; 523/223; 523/440; 524/437; 524/588; 524/589; 524/404; 524/424; 524/428
(58) Field of Search ................................ 524/404, 424, 524/428, 430, 437, 588, 589, 611; 523/220, 223; 423/440

(56) References Cited

U.S. PATENT DOCUMENTS

| | | | |
|---|---|---|---|
| 4,711,916 A | | 12/1987 | Hagiwara et al. |
| 5,008,307 A | * | 4/1991 | Inomata ...................... 523/220 |
| 5,021,494 A | * | 6/1991 | Toya ............................ 524/404 |
| 6,025,435 A | * | 2/2000 | Yamakawa et al. ......... 524/862 |
| 6,169,142 B1 | * | 1/2001 | Nakano et al. .............. 524/862 |
| 6,500,891 B1 | * | 12/2002 | Kropp et al. ................. 524/430 |
| 6,620,515 B2 | * | 9/2003 | Feng et al. ................... 428/447 |

FOREIGN PATENT DOCUMENTS

| | | | |
|---|---|---|---|
| EP | 0 496 419 A2 | 7/1992 | |
| EP | 0 499 585 A1 | 8/1992 | |
| EP | 0 750 008 A2 | 12/1996 | |
| EP | 0 933 397 A1 | 8/1999 | |
| JP | 55149343 A * | 11/1980 | ........... C08L/63/00 |
| JP | 63-20340 | 1/1988 | |
| JP | 01069661 A * | 3/1989 | ......... C08L/101/00 |
| JP | 01204952 A * | 8/1989 | ........... C08L/63/00 |
| JP | 03181547 A * | 8/1991 | ........... C08L/63/00 |
| JP | 07278415 A * | 10/1995 | ........... C08L/63/00 |
| JP | 11-87958 | 3/1999 | |
| JP | 11269352 A * | 10/1999 | ........... C08L/63/00 |
| JP | 2000-001616 | 1/2000 | |
| WO | WO 98/20072 A1 | 5/1998 | |
| WO | WO 02/098795 A1 | 12/2002 | |

OTHER PUBLICATIONS

Entries for aluminum oxide and poly(Bisphenol A–co–epichlorohydrin) taken from Aldrich Handbook of Fine Chemicals and Laboratory Equipment 2000–2001, pp. 57 and 1346.*

* cited by examiner

Primary Examiner—Margaret G. Moore
Assistant Examiner—Marc S Zimmer
(74) Attorney, Agent, or Firm—Crompton, Seager & Tufte, LLC

(57) ABSTRACT

A heat conductive sheet comprising organic matrix and heat conductive filler contained in the organic matrix at a volume percent between 30% and 80%. The heat conductive filler comprises spherical shaped alumina grains which have an average grain diameter in a range between 50 $\mu$m and 80 $\mu$m. The heat conductive filler includes micro grains having a grain diameter of 30 $\mu$m or less at a proportion of 5 volume % or less with respect to the total amount of the spherical shaped alumina grains.

9 Claims, No Drawings

SHEET FOR CONDUCTING HEAT

The present invention relates to a sheet for conducting heat. The heat conductive sheet of the invention can be used in electronic appliances, for example, by being interposed between a heat generating electronic component and a radiator, or between an electronic component and a metallic heat exchanger plate.

BACKGROUND OF THE INVENTION

With recent progress in performance of the electronic appliances, such as central processor unit (CPU) of computers, the power consumption is also increasing. The power consumption increases heat generation and the generated heat has an adverse effect on operation of the computers. Therefore, a technique for efficiently cooling the heat generated at the electronic devices is very important for maintaining the performance of the computers.

The heat conductive sheet of the invention is used in electronic appliances, for example, by being interposed between a heat generating electronic component and a radiator, or between an electronic component and a metallic heat exchanger plate. The heat conductive sheet which conducts heat from the electronic component to the radiator must have high thermal conductivity in order to efficiently cool the electronic devices as described above.

Japanese Laid-Open Patent Publication 63-20340 discloses a heat conductive sheet having a high thermal conductivity by densely filling the sheet with a heat conductive filler. The heat conductive filler comprises spherical alumina grains mixed into a composition comprising a synthetic resin and a rubber having high thermal conductivity. The spherical alumina grains have a shape devoid of cutting edges, have a maximum grain diameter of 150 $\mu$m, and have an average grain diameter between 5 and 35 $\mu$m. The spherical alumina grains described above can be easily dispersed into organic polymers and can be densely filled so that the spherical alumina grains are extremely useful for heat conductive filler used in a heat conductive sheet.

In addition to Japanese Laid-Open Patent Publication 63-20340, Japanese Laid-Open Patent Publications 11-87958 and 2000-1616 disclose the use of alumina fillers. Japanese Laid-Open Patent Publication 11-87958 discloses a filler in which alumina filler and another heat conductive filler are combined. Japanese Laid-Open Patent Publication 2000-1616 is directed to an organic matrix for mixing alumina at a high filling factor.

However, while attempts to densely fill the heat conductive filler have been made, the mechanism of how the high heat conductivity is attained by the high filling factor of the heat conductive filler has not been examined sufficiently. Therefore in some cases, the material including filler at a high filling factor due to dense filling of spherical alumina could have a lower thermal conductivity than that expected from the filler amount.

BRIEF SUMMARY OF THE INVENTION

The present invention has been made in recognition of the problems that existed in conventional art. An object of the invention is to provide a heat conductive sheet that sufficiently realizes the thermal conductivity that complies with high filler amount of the heat conductive filler.

In order to achieve the above objects, the present invention provides a heat conductive sheet comprising organic matrix and heat conductive filler contained in the organic matrix at a volume percent between 30% and 80%, wherein the heat conductive filler comprises spherical shaped alumina grains that have an average grain diameter in a range between 50 $\mu$m and 80 $\mu$m and that include micro-grains having a grain diameter of 30 $\mu$m or less at a proportion of 5 volume % or less with respect to the total amount of the spherical shaped alumina grains.

Other aspects and advantages of the invention will become apparent from the following description illustrating by way of example the principles of the invention.

DETAILED DESCRIPTION OF THE PREFERRED EMBODIMENTS

The heat conductive sheet of the invention contains thermally conductive filler at a high filling factor and realizes high thermal conductivity which complies with the high amount of heat conductive filler.

A heat conductive sheet according to one embodiment of the invention comprises an organic matrix and a heat conductive filler mixed into the organic matrix at 30 to 80 volume %. Spherical alumina powder may contain micro grains of 30 $\mu$m or less within the spherical alumina powder itself at 5 volume % or less. The average grain diameter is between 50 and 80 $\mu$m. A heat conductive sheet having a high thermal conductivity expected from the high filling amount of the heat conductive filler can thus be formed.

The organic matrix can be appropriately selected in compliance with various specifications (such as mechanical strength, heat resistivity, and wearability) without specific limitation to its composition, method for curing, and the like. Specifically, the organic matrix is selected among for example gel state materials such as silicone gel (gel rubber) and polyurethane gel, rubbers such as synthetic rubber and natural rubber, themoplastic resins such as epoxy resin and urethane resin, and thermoplastic elastomer. The organic material can be used in combination of a plurality of materials.

Among synthetic rubbers, silicone rubbers can be preferably used for its superior workability, high heat resistivity, and small temperature dependence on physical properties. More preferably used is a silicone gel, which has lower cross-linkage density than silicone rubbers and has extremely low degree of hardness. The silicon gel has superior adhesiveness to electronic components, followability, and reduced loading, in addition to having advantages of silicone rubbers. The silicone gel is an elastomeric silicone that is very soft and can be obtained by curing low viscosity liquid silicone.

Silicone rubbers can be obtained by curing any known polyorganosiloxane. The method for curing silicone rubbers can be, for example and without limitation, radical reaction by organic peroxide, addition reaction between polyorganosiloxane including a vinyl group and organohydrogen having a hydrogen atom coupled to a silicon atom with platinum catalyst, and condensation reactions.

The heat conductive filler includes spherical alumina powder as an essential component. Optionally, other heat conductive filler may be used in combination with the spherical alumina powder. In the case where a filler other than spherical alumina powder is used in addition, the spherical alumina powder is included in the heat conductive filler at an amount exceeding 50 volume % and the total of any component other than the spherical alumina powder is included at 50 volume % or less.

The spherical alumina powder comprises alumina grains having a spherical shape or a substantially spherical shape.

Since alumina powders have superior thermal conductivity, low viscosity, high electrical isolation, and low cost, they are optimal for a filler of a heat conductive sheet used in electronic components. The spherical alumina powder includes micro grains of grains diameter 30 μm or less at 5 volume % or less and the average grain size of the grains can be in a range between 50 and 80 μm. In the case where micro grains having grain diameter of 30 μm or less are scarcely included, that is, in the case where the amount of such micro grains is at 5 volume % or less, the grain diameters of the spherical alumina grains distribute with a state concentrated at around the average grain size. Accordingly, the grain sizes are distributed in a narrow and sharp zone.

If the proportion of micro grains having grain diameter of 30 μm or less exceeds 5 volume %, the proportion of micro grains with respect to the entire alumina grains will increase. Accordingly, when the average diameter is the same as the case where micro grains are scarcely contained, the proportion of the micro grains may be larger to make the grain size distributed in a large zone. The present invention used alumina grains in which the proportion of micro grains having grain diameters below 30 μm was 5 volume % or less.

In the case where the average diameter of spherical alumina grains exceeds 80 μm, the surface of the heat conductive sheet formed by mixing the spherical alumina grains in the organic matrix can become rough. The sheet having larger sized grains is inappropriate because the alumina grains fall off from the cut surface when the heat conductive sheet is cut off. On the other hand, when the average diameter of the spherical alumina grains is less than 50 μm, the number of grains may increase when the filler is filled into the organic matrix by the same volume due to smaller volume of each grain. The contact thermal resistance between the grains can increase when the number of grains increases to reduce the thermal conductivity, which is inappropriate. Accordingly, a heat conductive sheet in which grains would not fall off when the sheet is cut off and in which the thermal conductivity is good, can be obtained through the use of spherical alumina grains having an average diameter in a range between 50 and 80 μm.

The heat conductive filler preferably contains micro grain heat conductive filler having an average diameter below 5 μm, in addition to the spherical alumina powder. The proportion of the micro grain heat conductive filler is preferably between 20 and 50 volume % of the entire heat conductive filler. The micro grains of the micro grain heat conductive filler efficiently fill the gaps between spherical alumina grains to improve thermal conductivity. When the spherical alumina grains of the same amount of fillers are compared, the filler containing micro grain filler can improve the thermal conductivity than the case without micro grain filler. In addition, by filling the gaps between spherical alumina grains by the grains of the micro grain heat conductive filler, the viscosity of the composition is reduced to improve the workability when forming the heat conductive sheet.

In the case where the average grain size of the micro grain heat conductive filler is 5 μm or more, the gaps between the spherical alumina grains may not be sufficiently filled and the thermal conductivity of the heat conductive sheet may be degraded. In the case where the proportion of the micro grain heat conductive filler is below 20 volume %, the thermal conductivity may be degraded because the gaps between the spherical alumina grains are not filled. On the other hand, if the proportion of the micro grain heat conductive filler exceeds 50 volume %, the micro grain heat conductive filler may be filled at an amount exceeding that necessary for filling the gaps between the spherical alumina grains to cause the rise in viscosity and the degradation of the thermal conductivity. Therefore, a heat conductive sheet having superior thermal conductivity can be obtained by mixing a micro grain heat conductive filler having average grain diameter below 5 μm at a proportion of 20 to 50 volume % with respect to the heat conductive filler.

While non-spherical alumina grains, boron nitride, aluminum nitride, silicon carbide and carbon (carbon fiber, or the like) can be used for example as the micro grain heat conductive filler, the non-spherical alumina grains can be preferably used among these. The non-spherical alumina grains improve the thermal conductivity and decreases the viscosity of the composition by easily mixing and contacting with the spherical alumina grains. The workability and the formability in forming the heat conductive sheet are improved by reducing the viscosity. Moreover, the physical properties of alumina increase electric isolation of the heat conductive sheet.

Surface treatment may be formed on the spherical alumina grains and/or the micro grain heat conductive fillers by bind silane, titanate coupling agent, etc.

The proportion of the heat conductive filler is in a range between 30 and 80 volume % as described above. The proportion below 30 volume % is inappropriate because in that case the thermal conductivity of the heat conductive sheet may not be sufficient. On the other hand, when the proportion exceeds 80% the formation is difficult because the viscosity of the composition formed by mixing the heat conductive filler into the organic matrix may increase, and therefore that proportion is inappropriate. A heat conductive sheet superior both in thermal conductivity and formability can be obtained by providing the proportion of the heat conductive filler in a range between 30 and 80 volume %.

In one embodiment, an additional additive can be contained to the heat conductive filler. The examples of such additive may be for example, elasticizer, adhesive, reinforcing agent, coloring agent, and heat resistivity improvement agent.

A method for forming the heat conductive sheet is next described. The production method may comprise for example, without limitation, a step of mixing the heat conductive filler and optional additive into the organic matrix and agitating these, a step of forming a sheet shape by techniques such as bar coater, doctor blade, extrusion formation by T-die or calendar formation, after dispersion.

The thermal conductivity of the heat conductive sheet thus obtained is preferably 1.0 W/mK or more. The heat generated from electric components can not be sufficiently transmitted to the cooling device if the thermal conductivity is below 1.0 W/mK.

The hardness of the heat conductive sheet is preferably 50 or less by Asker Type C hardness. The Asker Type C hardness exceeding 50 is not desirable because the followability to the shape of heat-generating component can be poor, or the attachment to the component can destruct the heat-generating component. Asker Type C hardness is based on SRIS0101 standard defined by The Society of Rubber Industry, Japan.

The thickness of the heat conductive sheet may preferably be in a range between 0.1 and 5 mm. The workability is poor when the thickness is thinner than 0.1 mm which leads to poor productivity. On the other hand, a thickness exceeding 5 mm can increase the heat resistivity of the heat conductive sheet and such a high thickness is not preferable from the aspect of the production cost.

The heat conductive sheet can be used by providing or embedding a lamination of sheet-shaped, fiber-shaped, or meshed members on one side or both sides of the sheet, for improving workability and enhancement.

By interposing the heat conductive sheet of this embodiment between a heat-generating electric component and a radiator, or between a heat-generating electric component and a metallic heat exchanger, heat dissipation from the heat-generating components can be efficiently performed, and the properties of the electronic devices can be maintained in a long term. Therefore, the heat conductive sheet of the invention has an industrial advantage in that it provides high function, small size, and light weight for information devices, video devices and mobile communication devices.

The present invention is described in more detail by showing examples and comparative examples.

EXAMPLES 1 TO 3

An addition-type silicone gel having a specific gravity of 1.0 (Model SLM 77094 manufactured by Wacker Asahi Kasei Silicone Co., Ltd.) was used as the organic matrix. A mixture of spherical shaped alumina grains and non-spherical alumina grains for micro grain heat conductive filler was used for the heat conductive filler. The heat conductive filler was mixed into silicone gel 100 weight part by the ratio shown in Table 1. Note that the amount of each composition is shown by volume % in Table 1.

TABLE 1

|  | Example 1 | Example 2 | Example 3 | Example 4 |
|---|---|---|---|---|
| Total amount of heat conductive filler (%) | 70 | 70 | 70 | 70 |
| Proportion of spherical alumina in the heat conductive filler (%) | 80 | 65 | 50 | 100 |
| Proportion of non-spherical alumina in the heat conductive filler (%) | 20 | 35 | 50 | 0 |
| Viscosity (Pa · s) | 74 | 63 | 82 | 105 |
| Thermal conductivity (W/m · K) | 4.8 | 5.5 | 4.7 | 3.9 |

The addition type silicone gel was obtained through addition reaction between polyorganosiloxane having a vinyl group and organohydrogen with platinum catalyst. The organohydrogen had a hydrogen atom coupled to a silicon atom.

The spherical alumina grains contained micro grains having grain diameter of 30 μm or less at 1 volume % and the average grain diameter of the entire grains was 60 μm. The non-spherical alumina grains had an average diameter of 3 μm.

The silicone composition was mixed and agitated by agitation and deaerating apparatus until the silicone composition was uniform, and the viscosity of the composition at 25° C. was measured by a rotational viscometer. Further, the composition was cured by heating at 120° C. for 30 minutes and a heat conductive sheet having a thickness of 1 mm was fabricated.

A thermal conductivity of the heat conductive sheet obtained was measured. The thermal conductivity was a thermal conductivity in a direction of the thickness when the sheet was compressed by 10%.

EXAMPLE 4

A heat conductive sheet was fabricated similarly to Example 1 except that only spherical alumina grains were used for the heat conductive filler in comparison to Example 1. The viscosity of the silicone composition and the thermal conductivity of the heat conductive sheet were measured. The method for measuring the viscosity and the thermal conductivity were the same as those of Examples 1 through 3. The results were shown in Table 1.

EXAMPLES 5 AND 6

A heat conductive sheet was fabricated similarly to that of Example 1 except that the proportion of mixing the spherical alumina grains and non-spherical alumina grains in the heat conductive filler were changed. The viscosity of the silicone composition and the thermal conductivity of the heat conductive sheet were measured. The method for measuring the viscosity and the thermal conductivity were the same as those of Examples 1 through 4. The results were shown in Table 2. Note that the amount of each composition is shown by volume % in Table 2.

TABLE 2

|  | Example 5 | Example 6 | Comparative Example 1 | Comparative Example 4 |
|---|---|---|---|---|
| Total amount of heat conductive filler (%) | 70 | 70 | 70 | 70 |
| Proportion of spherical alumina in the heat conductive filler (%) | 85 | 45 | 65 | 65 |
| Proportion of non-spherical alumina in the heat conductive filler (%) | 15 | 55 | 35 | 35 |
| Viscosity (Pa · s) | 96 | 100 | 160 | 113 |
| Thermal conductivity (W/m · K) | 4.4 | 4.1 | 4.3 | 4.5 |

Comparative Example 1

A heat conductive sheet was fabricated similarly to that of Example 1 except that a powder containing micro grains of 30 μm or less at 10 volume % was used as the spherical alumina grains. The viscosity of the silicone composition and the thermal conductivity of the heat conductive sheet were measured. The method for measuring the viscosity and the thermal conductivity were the same as those of Examples 1 through 6. The results were shown in Table 2.

Comparative Example 2

A heat conductive sheet was fabricated similarly to that of Example 1 except that a powder having an average grain diameter of 48 μm was used as the spherical alumina grains. The viscosity of the silicone composition and the thermal conductivity of the heat conductive sheet were measured. The method for measuring the viscosity and the thermal conductivity were the same as those of Examples 1 through 6 and Comparative Example 1. The results were shown in Table 2.

While the proportion of mixing the spherical alumina grains and non-spherical alumina grains was the same as the Example 2 in the Comparative Examples 1 and 2, each of the proportion of micro grains in the spherical alumina grains and the average grain diameter of the spherical alumina grains differed. The proportion of micro grains was higher in Comparative Example 1 than Example 2 and the average diameter was smaller in Comparative Example 2 than Example 2. It is shown that both the viscosity and the thermal conductivity were superior in Example 2 than Comparative Examples 1 and 2. In the case where non-spherical alumina grains were mixed as the micro grain heat conductive filler (Examples 5 and 6), the viscosity and the thermal conductivity improved compared to the case where non-spherical alumina grains were not used (Example 4).

It should be apparent to those skilled in the art that the present invention may be embodied in many other specific forms without departing from the spirit or scope of the invention. Particularly, it should be understood that the invention may be embodied in the following forms.

As for alumina (aluminum oxide), β-type ($Na_2O.11Al_2O_3$) and γ-type may also be used as well as generally used α-type.

A metal oxide having a spherical shape can also be used as a heat conductive filler other than spherical alumina grains.

It is also possible to mix a heat conductive filler having an average grain diameter of 5 $\mu$m or more with respect to the entire heat conductive filler so that the micro grain heat conductive filler having an average grain diameter below 5 $\mu$m occupy 20 to 50 volume percent of the heat conductive filler.

Therefore, the present examples and embodiments are to be considered as illustrative and not restrictive and the invention is not to be limited to the details given herein, but may be modified within the scope and equivalence of the appended claims.

What is claimed is:

1. A heat conductive sheet comprising organic matrix and heat conductive filler contained in the organic matrix at a volume percent between 30% and 80%, wherein the heat conductive filler comprises spherical shaped alumina grains which have a average grain diameter in a range between 50 $\mu$m and 80 $\mu$m and which include micro-grain having a grain diameter of 30 $\mu$m or less at a proportion of 5 volume % or less with respect to he total amount of the spherical shaped alumina grains.

2. A heat conductive sheet according to claim 1 further comprising a fine powdery heat conductive filler having an average grain diameter of 5 $\mu$m or less at a proportion between 20 volume % and 50 volume % in the total amount of the heat conductive filler.

3. A heat conductive sheet according to claim 2 wherein the fine powdery heat conductive filler is selected from the group consisting of non-spherical shaped alumina, boron nitride, aluminum nitride, silicon carbide, and carbon.

4. A heat conductive sheet according to claim 1 wherein the organic matrix is selected from the group consisting of a silicone gel, a polyurethane gel, a synthetic rubber, a natural rubber, an epoxy resin, a urethane resin, and thermoplastic elastomer.

5. A heat conductive sheet according to claim 1 wherein the organic matrix is silicone rubber.

6. A heat conductive sheet according to claim 1 wherein the heat conductive sheet has a heat conductivity at 1.0 W/mK or more.

7. A heat conductive sheet according to claim 1 wherein the heat conductive sheet has Asker C hardness of 50 or less.

8. A heat conductive sheet comprising organic matrix and heat conductive filler contained in the organic matrix at a volume percent between 30% and 80% wherein the heat conductive filler comprises spherical shared alumina grains having an average grain diameter in a range between 50 $\mu$m and 80 $\mu$m and a second type of heat conductive filler grains having an average grain diameter at 5 $\mu$m or less wherein the second type of heat conductive filler grains are contained in the heat conductive filler at a proportion between 20 volume % and 50 volume % and wherein the organic matrix is selected from the group consisting of a silicone rubber, a silicone gel, a polyurethane gel, a synthetic rubber, a natural rubber, a urethane resin, and thermoplastic elastomer.

9. A heat conductive sheet comprising organic matrix and heat conductive filler contained in the organic matrix at a volume percent between 30% and 80% wherein the heat conductive filler comprises spherical shared alumina grains having an average grain diameter in a range between 50 $\mu$m and 80 $\mu$m and a second type of heat conductive filler grains having an average grain diameter at 5 $\mu$m or less, wherein the second type of heat conductive filler grains are contained in the heat conductive filler at a proportion between 20 volume % and 50 volume % wherein the second type of heat conductive filler is selected from the group consisting of non-spherical shaped alumina, boron nitride, aluminum nitride, silicon carbide, and carbon.

* * * * *

UNITED STATES PATENT AND TRADEMARK OFFICE
CERTIFICATE OF CORRECTION

PATENT NO.    : 6,828,369 B2
DATED         : December 7, 2004
INVENTOR(S)   : Kouya Takahashi et al.

It is certified that error appears in the above-identified patent and that said Letters Patent is hereby corrected as shown below:

<u>Column 7,</u>
Line 41, delete "have a average" and insert therefor -- have an average --.
Line 42, delete "micro-grain" and insert therefor -- micro-grains --.
Line 44, delete "to he total" and insert therefor -- to the total --.

<u>Column 8,</u>
Lines 23 and 36, delete "shared" and insert therefor -- shaped --.

Signed and Sealed this

Fifth Day of April, 2005

JON W. DUDAS
*Director of the United States Patent and Trademark Office*